United States Patent
Park

(10) Patent No.: US 9,627,075 B1
(45) Date of Patent: Apr. 18, 2017

(54) SEMICONDUCTOR MEMORY DEVICE AND SEMICONDUCTOR SYSTEM

(71) Applicant: SK hynix Inc., Gyeonggi-do (KR)

(72) Inventor: Won-Sun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/147,338

(22) Filed: May 5, 2016

(30) Foreign Application Priority Data

Dec. 16, 2015 (KR) .................. 10-2015-0179923

(51) Int. Cl.
*G11C 16/14* (2006.01)
*G11C 16/08* (2006.01)
*G11C 16/34* (2006.01)
*G11C 16/26* (2006.01)

(52) U.S. Cl.
CPC .............. *G11C 16/14* (2013.01); *G11C 16/08* (2013.01); *G11C 16/26* (2013.01); *G11C 16/3459* (2013.01)

(58) Field of Classification Search
CPC ......... G11C 16/14; G11C 16/08; G11C 16/26; G11C 5/148; G11C 7/20
USPC ................................. 365/185.22, 191, 195
See application file for complete search history.

(56) References Cited

U.S. PATENT DOCUMENTS

| | | | |
|---|---|---|---|
| 2002/0105829 A1* | 8/2002 | Akamatsu | G11C 16/30 365/185.18 |
| 2006/0268649 A1* | 11/2006 | Tokieda | G06F 12/0215 365/230.03 |
| 2014/0063948 A1* | 3/2014 | Lim | G11C 16/06 365/185.11 |
| 2014/0181621 A1 | 6/2014 | Lin et al. | |
| 2014/0269127 A1* | 9/2014 | Hung | G11O 5/145 365/203 |

FOREIGN PATENT DOCUMENTS

KR          100516694          9/2005

* cited by examiner

*Primary Examiner* — Tan T Nguyen
(74) *Attorney, Agent, or Firm* — IP & T Group LLP

(57) ABSTRACT

A semiconductor memory device may include: a memory cell array comprising a plurality of memory cells coupled to a plurality of bit line pairs and a plurality of word lines; and an operation circuit suitable for setting a parameter corresponding to an input command, and performing an operation corresponding to the input command on the memory cell array based on the set parameter, wherein, when the input command is of the same type as a previous input command, the operation circuit skips setting the parameter for each of preset word line groups.

18 Claims, 11 Drawing Sheets

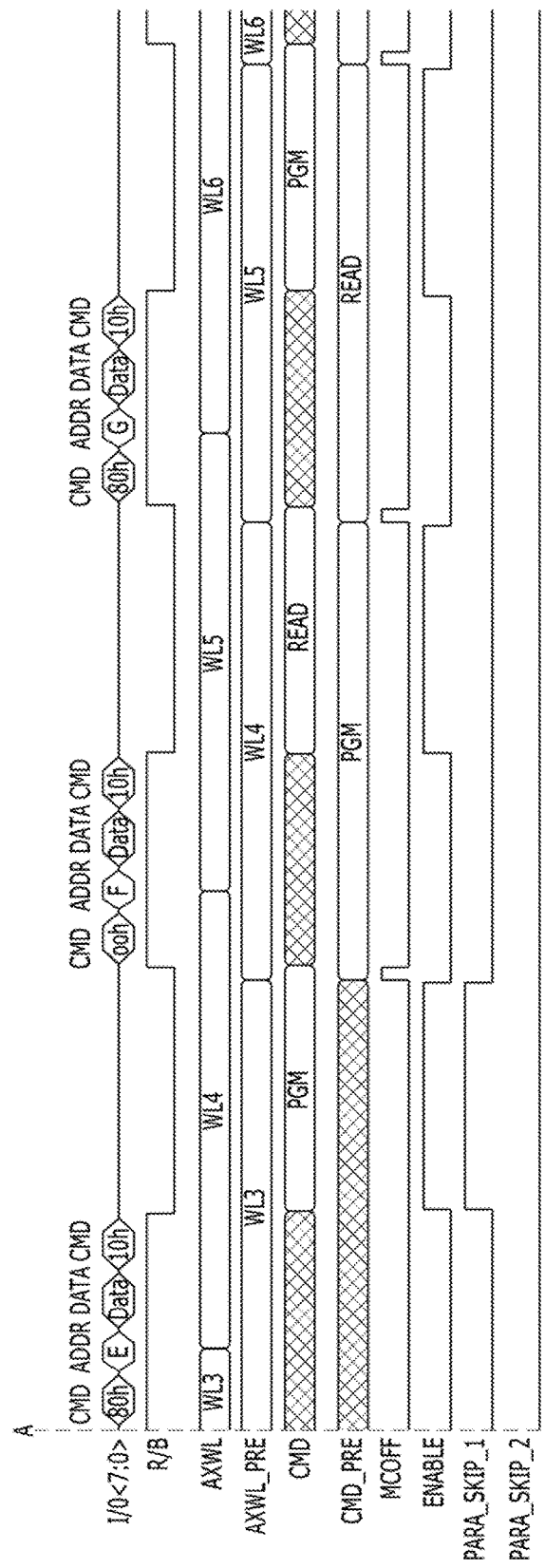

SEMICONDUCTOR MEMORY DEVICE AND SEMICONDUCTOR SYSTEM

CROSS-REFERENCE TO RELATED APPLICATIONS

The present application claims priority of Korean Patent Application No. 10-2015-0179923, filed on Dec. 16, 2015, which is incorporated herein by reference in its entirety.

BACKGROUND

1. Field

Exemplary embodiments of the present invention relate generally to a semiconductor design technology and, more particularly, to a semiconductor memory device and a semiconductor system including the same.

2. Description of the Related Art

Semiconductor memory devices are categorized into volatile memory devices and nonvolatile memory devices.

A volatile memory device has a relatively high write and read speed, but loses data stored therein when power supply is cut off. On the other hand, a nonvolatile memory device has a relatively low write and read speed, but retains data stored therein when power supply is cut off. Thus, a nonvolatile memory device is used for storing data which must be retained regardless of whether or not power is supplied to the device. Examples of nonvolatile memory devices include ROM (Read Only Memory), MROM (Mask ROM), PROM (Programmable ROM), EPROM (Erasable Programmable ROM), EEPROM (Electrically Erasable Programmable ROM), flash memory, PRAM (Phase change Random Access Memory), MRAM (Magnetic RAM), RRAM (Resistive RAM), and FRAM (Ferroelectric RAM). A flash memory may be a NOR or a NAND type.

A flash memory has not only an advantage of RAM which can freely program or erase data, but also an advantage of ROM which can retain data stored therein even though power supply is cut off. Flash memory is widely used as a storage medium of a portable electronic device, such as a digital camera, a PDA (Personal Digital Assistant), or an MP3 player.

During at least one of a program, read and erase operation, a nonvolatile memory device must set the parameters for performing an operation, for example, word line voltages (that is, a program voltage, a read voltage, and a pass voltage) to be supplied to word lines and a voltage supplied to a bulk (i.e., a well region) in which memory cells are formed, before performing an operation corresponding to each command. Thus, when a command is received, the overall operation time is increased due to the time required for setting the parameters needed for performing an operation corresponding to the received command.

Thus, there is a demand for a scheme for improving the overall operation performance of a semiconductor device such as a flash memory device by reducing the time required for setting the parameters needed for performing an operation corresponding to a received command.

SUMMARY

Various embodiments are directed to a semiconductor memory device capable of improving the overall operation performance by preventing setting duplicate parameters for each of a plurality of preset word line groups, when a currently inputted command is of the same type as a previously inputted command.

Also, various embodiments are directed to a semiconductor system capable of improving an entire operation performance by skipping setting duplicate parameters, when a current input operation code is the same type of code as a previous operation code.

In an embodiment, a semiconductor memory device may include: a memory cell array comprising a plurality of memory cells coupled to a plurality of bit line pairs and a plurality of word lines; and an operation circuit suitable for setting a parameter corresponding to an input command, and performing an operation corresponding to the input command on the memory cell array based on the set parameter, wherein, when the input command is of the same type as a previous input command, the operation circuit skips setting the parameter for each of preset word line groups.

In an embodiment, a semiconductor memory device may include: a memory cell array comprising a plurality of memory cells, wherein word lines of the memory cells are grouped by a predetermined number of word lines; a parameter setting control unit suitable for detecting whether a word line corresponding to an input address and a word line corresponding to the previous input address are classified into the same word line group, based on preset word line groups, and generating a plurality of parameter skip signals, when an input command is of the same type as the previous Input command; a control signal generation unit suitable for selectively skipping setting parameters for performing an operation corresponding to the input command according to the plurality of parameter skip signals, and generating a control signal based on the one or more parameters; a voltage supply unit suitable for generating operation voltages for at least one of a program, read and erase operations according to the control signal; an address decoder suitable for selecting a word line of the memory cell array according to the input address, and selectively applying the operation voltages to the respective word lines of the memory cell array according to the control signal; and a read and write circuit coupled to bit lines of the memory cell array and suitable for reading/writing data of the memory cell array according to the control signal.

In an embodiment, a semiconductor system may include: a controller suitable for outputting an operation code for performing various operations; and a semiconductor device suitable for setting a parameter corresponding to the operation code, and performing an operation corresponding to the operation code based on the set parameter, wherein the semiconductor device skips setting the parameter when the operation code is the same type of code as the previous operation code.

In an embodiment, an operating method of a semiconductor memory device may include: receiving an input command and input address; comparing the input command to the previous input command; detecting whether a word line corresponding to the input address and a word line corresponding to the previous input address correspond to the same word line group, when the input command is the same type of command as the previous input command; setting a parameter corresponding to the word line group when the word line corresponding to the input address and the word line corresponding to the previous input address correspond to different word line groups performing an operation corresponding to the input command based on the set parameter; and storing the input command and input address as the previous command and previous address.

The operating method may further include setting all parameters corresponding to the input command when the input command and the previous input command do not coincide with each other. The detecting of whether the word line corresponding to the input address and the word line corresponding to the previous Input address correspond to the same word line group may include: grouping the word line corresponding to the input address, based on the preset word line groups; grouping the word line corresponding to the previous input address, based on the preset word line groups; and comparing the grouping values. The setting of the parameter may include accessing a first register to load a specific value corresponding to the parameter, performing an operation on the specific value, and storing the final parameter value in a second register.

BRIEF DESCRIPTION OF THE DRAWINGS

FIGS. 9A and 9B are waveform diagrams for describing an operation of the nonvolatile memory device illustrated in FIGS. 3 to 8, according to an embodiment of the present invention.

DETAILED DESCRIPTION

Figure 1:
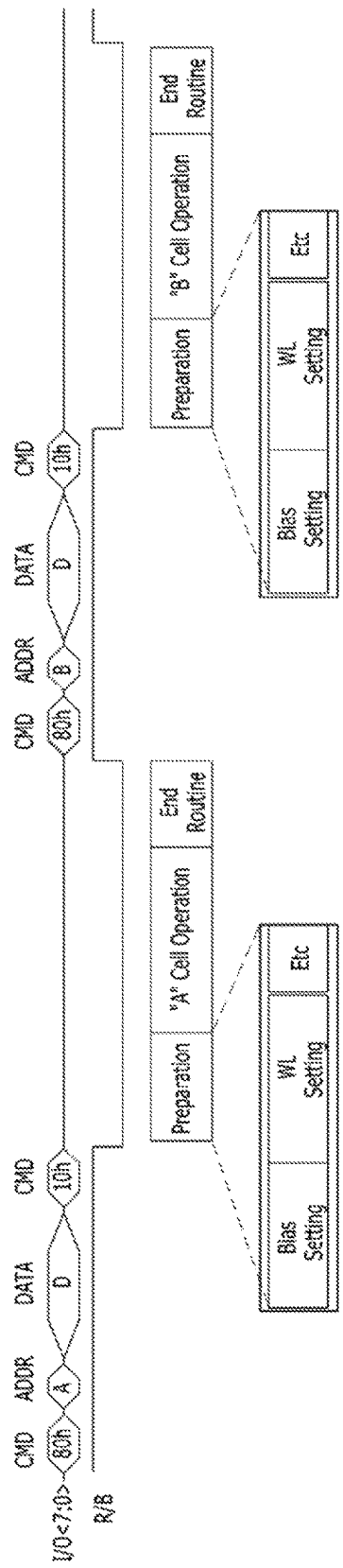
FIG. 1 is a timing diagram of an operation of a conventional nonvolatile memory device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one element not only directly coupling another element but also indirectly coupling another element through an intermediate component. It will be understood that, although the terms "first", "second", "third", and so on may be used herein to describe various elements, these elements are not limited by these terms. These terms are used to distinguish one element from another element. Thus, a first element could be termed a second element or a third element without departing from the spirit and scope of the present invention. In addition, it will also be understood that when an element is referred to as being "between" two elements, it can be the only element between the two elements, or one or more intervening elements may also be present.

It will be further understood that the terms "comprises", "comprising", "includes", and "including" when used in this specification, specify the presence of the stated elements, but do not preclude the presence or addition of one or more other elements.

The terminology used herein is for the purpose of describing particular embodiments only and is not intended to be limiting of the present invention. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present disclosure.

Hereinafter, the various embodiments of the present invention will be described in detail with reference to the drawings.

Figure 2:
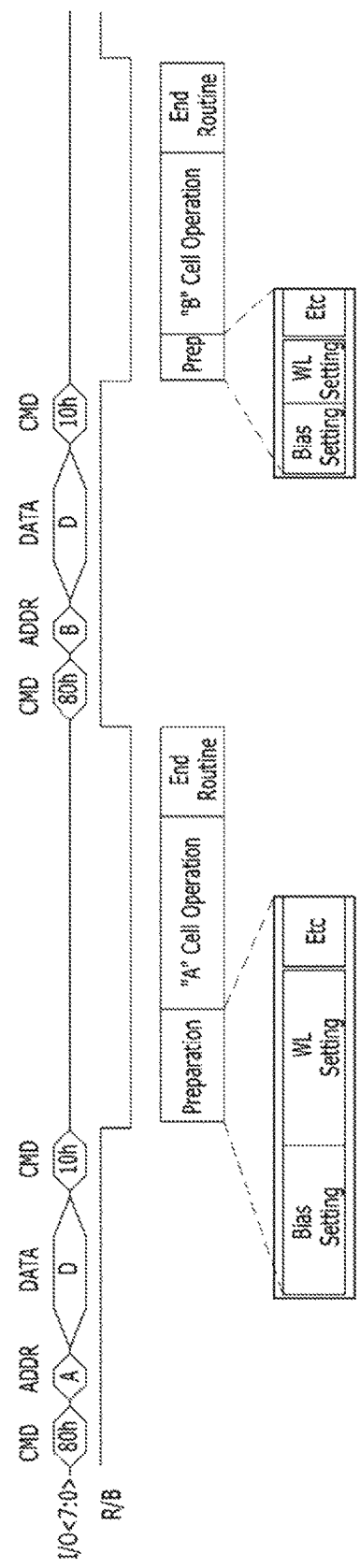
FIG. 2 is a timing diagram of an operation of a nonvolatile memory device, according to an embodiment of the present invention.

FIG. 1 is a timing diagram of an operation of a conventional nonvolatile memory device, whereas FIG. 2 is a timing diagram of an operation of a nonvolatile memory device according to an embodiment of the present invention. Hereafter, a nonvolatile memory device will be taken as an example for describing a semiconductor memory device. For reference, FIGS. 1 and 2 are focused on a program operation of a nonvolatile memory device, however, we note that similar descriptions may be applied to a read operation.

Referring to FIG. 1, a command indicating a program operation may be inputted to a nonvolatile memory device (not illustrated) from a controller (not illustrated) through an I/O line I/O<7:0>. At this time, the command may be selected from a plurality of commands which are defined in the specification for the nonvolatile memory device, for example, 00h, 05h, 10h, 11h, 30h, 35h, 60h, 70h, 7Bh, 80h, 81h, 85h, 90h, D0h, E0h, F1h, F2h, FFh and the like. In order to perform the program operation, a program sequence start command "80h", an address "A", page data "D", and a program sequence end command "10h" may be sequentially inputted. At this time, after the program sequence end command "10h" is inputted, a ready/busy signal R/B of the nonvolatile memory device may transit to a low level from a high level. Thus, the input data "D" may be programmed into memory cells having an address corresponding to the input address "A".

At this time, the program operation period may be divided into a preparation period, a cell operation period, and an end routine period. During the preparation period, a setting operation for setting a bias and a word line may be performed. For this operation, the nonvolatile memory device may access a separate register to load a specific value, perform a computing operation on the specific value, and store a final parameter value in a target register.

The nonvolatile memory device may include a flash memory device, for example. With the increase in the number of word lines stacked in a flash memory having a 3D structure, the number of parameters which are to be set has also increased gradually.

According to existing operation schemes, however, a parameter value for performing an operation corresponding to an Input command is reset each time, after the command inputted. Thus, the time required for a program operation (that is, tPROG) is increased.

The flash memory device having a 3D structure may group a plurality of word lines into a given number of groups, in order to reduce a speed difference between the word lines. At this time, partial parameters of the word lines within the same group may have the same parameter value. The partial parameters may include a program verification voltage level, a program start bias voltage, a pass voltage (VPASS), a pipe gate voltage, a dummy word line voltage, a source line (DSL/SSL) voltage, a blind number, and a maximum loop number.

Thus, referring to FIG. 2, when a currently inputted command is of the same type as a previously inputted command, the nonvolatile memory device may skip setting duplicate parameters for each of a preset word line groups while maintaining the previous values of the parameters. Thus, the nonvolatile memory device can reduce the time required for the preparation period in the program operation time, that is, the time required for setting the bias and the word line, thereby reducing the overall program operation time.

Figure 3:
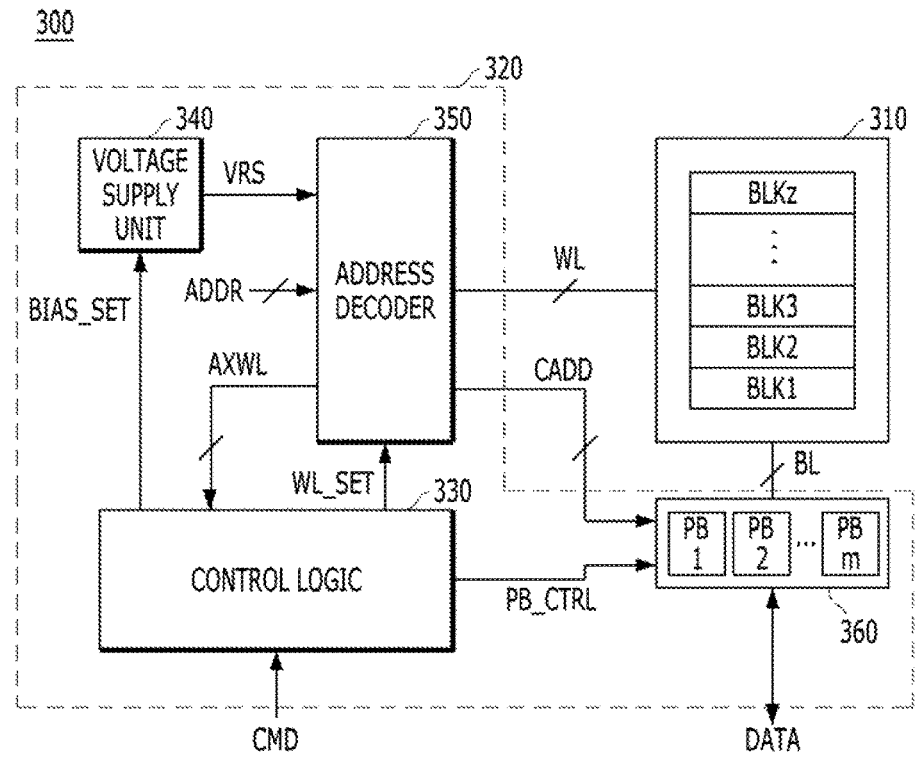
FIG. 3 is a block diagram of a nonvolatile memory device, according to an embodiment of the present invention.

FIG. 3 is a block diagram of a nonvolatile memory device 300, according to an embodiment of the present invention.

Referring to FIG. 3, the nonvolatile memory device 300 may include a memory cell array 310 and an operation circuit 320.

The memory cell array 310 may include a plurality of memory blocks BLK1 to BLKz. Each of the memory blocks BLK1 to BLKz may include a plurality of memory cells which are coupled to a plurality of bit line pairs and a plurality of word lines. In an embodiment, the plurality of memory cells may include nonvolatile memory cells. Among the plurality of memory cells, memory cells coupled to the same word line may be defined as one page. That is, the memory cell array 310 may include a plurality of pages.

The operation circuit 320 may set one or more parameters corresponding to an input command CMD, and perform an operation corresponding to the input command CMD on the memory cell array 310 based on the one or more parameters. At this time, when the input command CMD is of the same type as the previous input command CMD, the operation circuit 302 may skip setting duplicate parameters for each of a preset word line groups. At this time, the word line groups may be preset according to one or more of a program verification voltage level, a program start bias voltage, a pass voltage, a pipe gate voltage, a dummy word line voltage, a source line (DSL/SSL) voltage, the blind number, and the maximum loop number. For reference, when it is assumed that a program loop is repeatedly performed by a program operation and a program verification operation, the blind number denotes the number of the program verification operations skipped during the program loop, and the maximum loop number denotes a maximum number of a count of the program loop.

The operation circuit 320 may include a control logic 330, a voltage supply unit 340, an address decoder 350, and a read and write circuit 360.

The control logic 330 may be coupled to the address decoder 350, the read and write circuit 360, and the voltage supply unit 340. The control logic 330 may receive the input command CMD through an I/O buffer (not illustrated) of the nonvolatile memory device 300, and generate a voltage setting signal BIAS_SET, a word line setting signal WL_SET, and a read/write control signal PB_CTRL for controlling the overall operations of the nonvolatile memory device 300 in response to the input command CMD. In particular, the control logic 330 in accordance with an embodiment of the present invention may set one or more parameters corresponding to the input command CMD, and perform an operation corresponding to the input command CMD, that is, at least one of a program, read and erase operations on the memory cell array 310, based on the one or more set parameters. When the current input command CMD is of the same type as the previous input command CMD, the control logic 330 may skip setting duplicate parameters for each of the preset word line groups. For example, the control logic 330 may receive an address of a word line corresponding to an input address ADDR (hereafter, referred to as 'target word line AXWL') from the address decoder 350.

The voltage supply unit 340 may generate operation voltages VRS for at least one of a program, read and erase operations in response to the voltage setting signal BIAS_SET outputted from the control logic 330. The operation voltages VRS may include an erase voltage VERASE, a program voltage VPGM, a read voltage VREAD, a pass voltage VPASS, a source line voltage VDSL/VSSL, a common source voltage VSL, and a pipe gate voltage VPG.

The address decoder 350 may be coupled to the memory cell array 310 through the word lines WL. The address decoder 350 may receive the input address ADDR through the I/O buffer in the nonvolatile memory device 300, decode the input address ADDR to select a word line WL of the memory cell array 310, and provide the selected word line WL as the target word line AXWL to the control logic 330. The address decoder 350 may selectively apply the operation voltage VRS provided from the voltage supply unit 340 to the respective word lines WL of the memory cell array 310 in response to the word line setting signal WL_SET outputted from the control logic 330. For example, during a read operation, the address decoder 350 may apply the read voltage VREAD provided from the voltage supply unit 340 to a selected word line among word lines of a selected memory block, and during a program operation, the address decoder 350 may apply the program voltage VPGM provided from the voltage supply unit 340 to a selected word line among word lines of a selected memory block, and apply the pass voltage VPASS to the other word lines. The at least one of a program, or a read operations of the nonvolatile memory device 300 may be performed on a page basis. The input address ADDR received when a at least one of a program, or a read operation is requested may include a block address, a row address, and a column address. The address decoder 350 may respectively select one memory block and one word line according to the block address and the row address. The column address CADD may be decoded by the address decoder 350 and provided to the read and write circuit 360.

The read and write circuit 360 may include a plurality of page buffers PB1 to PBm. The plurality of page buffers PB1 to PBm may be coupled to the memory cell array 310 through bit lines BL1 to BLm. During a read operation, each of the page buffers PB1 to PBm may sense a program state of a memory cell corresponding to the column address CADD and output the sensed state as read data DATA. The read and write circuit 360 may be operated in response to the read/write control signal PB_CTRL outputted from the control logic 330. In an embodiment, the read and write circuit 360 may include page buffers (or page registers), a column selection circuit (not illustrated) and the like.

Figure 4:
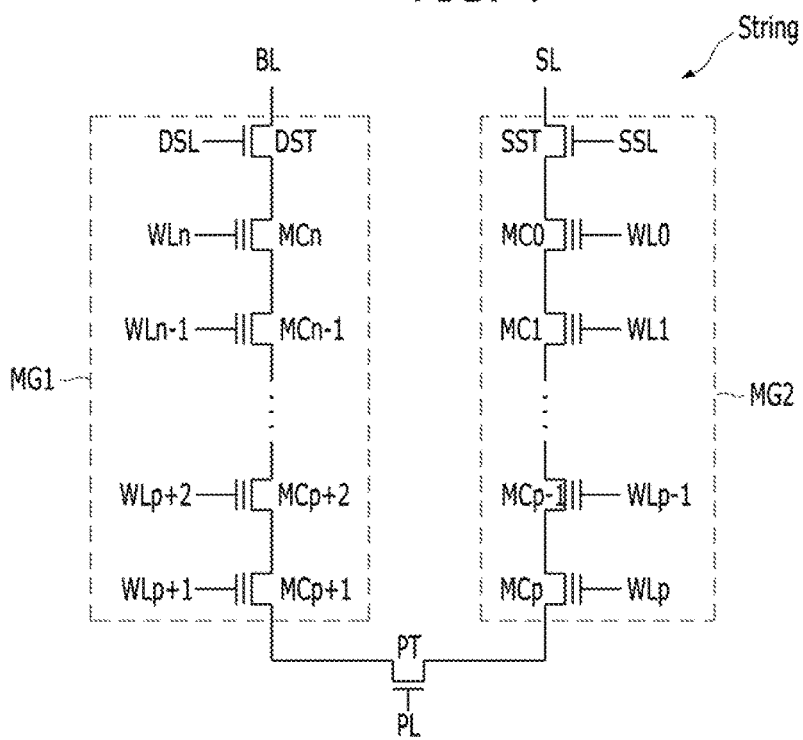
FIG. 4 is a block diagram illustrating a memory cell array of FIG. 3, according to an embodiment of the present invention.

FIG. 4 is a block diagram illustrating the memory cell array 310 of FIG. 3, according to an embodiment of the invention.

Referring to FIG. 4, each of the memory blocks BLK1 to BLKz of the memory cell array 310 may include a plurality of cell strings. Each of the cell strings may include a drain select transistor DST, a first memory cell group MG1, a pipe transistor PT, a second memory cell group MG2, and a source select transistor SST, which are coupled in series between a bit line BL and a source line SL.

The first memory cell group MG1 may include (p+1)th to nth memory cells MCp+1 to MCn, and the second memory cell group MG2 may include zeroth to pth memory cells MC0 to MCp.

The drain select transistor DST may have a gate coupled to a drain select line DSL, and the source select transistor SST may have a gate coupled to a source select line SSL. The (p+1)th to nth memory cells MCp+1 to MCn of the first memory cell group MG1 may have a gate coupled to word lines WLp+1 to WLn, respectively, and the zeroth to pth memory cells MC0 to MCp of the second memory cell group MG2 may have a gate coupled to word lines WL0 to WLp, respectively. The pipe transistor PT may have a gate coupled to a pipe line PL.

Figure 5:
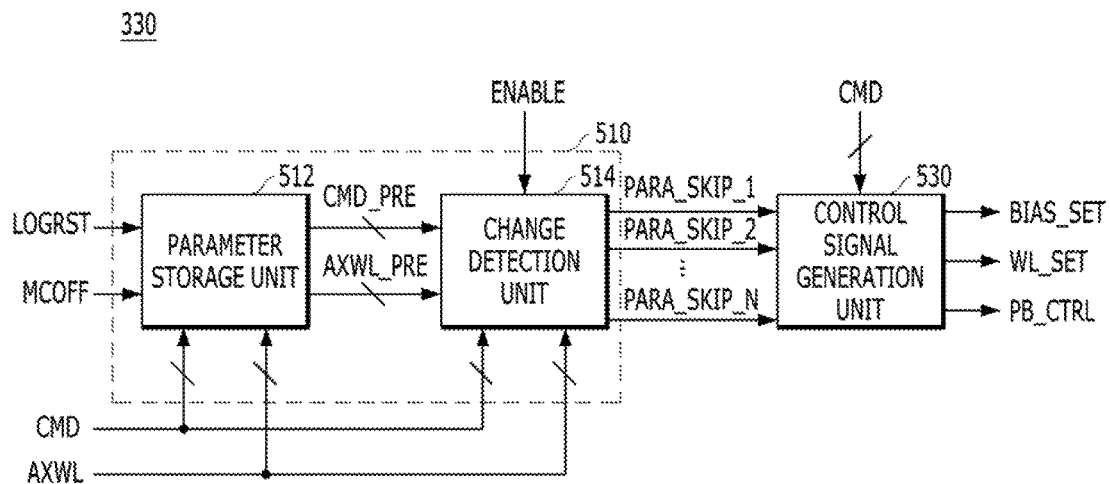
FIG. 5 is a detailed block diagram of a control logic of FIG. 3, according to an embodiment of the present invention.

FIG. 5 is a detailed block diagram of the control logic 330 of FIG. 3, according to an embodiment of the invention. FIG. 5 illustrates an example configuration for describing a characteristic operation among a plurality of operations of the control logic 330, for setting the parameters, according to an embodiment of the invention.

Referring to FIG. 5, the control logic 330 may include a parameter setting control unit 510 and a control signal generation unit 530.

The parameter setting control unit 510 may receive the input command CMD received from the control logic (330 of FIG. 3). When the input command CMD is of the same type as the previous input command CMD_PRE, the parameter setting control unit 510 may detect whether the target word line AXWL corresponding to the input address (ADDR of FIG. 3) and the previous target word line AXWL_PRE corresponding to the previous input address are classified into the same word line group, and generate parameter skip signals PARA_SKIP_1, PARA_SKIP_2, . . . , PARA_SKIP_N. At this time, a word line group may be configured by grouping word lines using the same parameter value. For example, assuming that eight word lines WL1 to WL8 exist, the first and second word lines WL1 and WL2 using a first program start bias voltage may be set to a first word line group, and third to eighth word lines WL3 to WL8 using a second program start bias voltage may be set to a second word line group. Or according to another example, the first to third word lines WL1 to WL3 using a first pass voltage may be set to a first word line group, the fourth and fifth word lines WL4 to WL5 using a second pass voltage may be set to a second word line group, and the sixth to eighth word lines WL6 to WL8 using a third pass voltage may be set to a third word line group. According to the present embodiment, the parameter setting control unit 510 may generate the plurality of parameter skip signals PARA_SKIP_1, PARA_SKIP_2, . . . , PARA_SKIP_N according to the word line groups which may be grouped, for example, according to the various methods mentioned above, and selectively perform parameter setting according to the parameter skip signals PARA_SKIP_1, PARA_SKIP_2, . . . , PARA_SKIP_N.

More specifically, the parameter setting control unit 510 may include a parameter storage unit 512 and a change detection unit 514.

The parameter storage unit 512 may store the input command CMD, and the target word line AXWL corresponding to the input address ADDR, in response to an operation end signal MCOFF. The parameter storage unit 512 may be reset in response to a reset signal LOGRST. When the input command CMD is of the same type as the previous input command CMD_PRE stored in the parameter storage unit 512, the change detection unit 514 may detect whether the target word line AXWL corresponding to the input address ADDR and the previous target word line AXWL_PRE stored in the parameter storage unit 512 are classified into the same word line group, in response to an operation enable signal ENABLE, and output the parameter skip signals PARA_SKIP_1, PARA_SKIP_2, . . . , PARA_SKIP_N.

At this time, the operation end signal MCOFF may be activated whenever an operation corresponding to the input command CMD is finished, and the operation enable signal ENABLE may be activated while the operation corresponding to the input command CMD is performed. The operation end signal MCOFF, the operation enable signal ENABLE, and the reset signal LOGRST may be generated through other units (not illustrated) of the control logic 330, and then applied to the parameter setting control unit 510.

The control signal generation unit 530 may set one or more parameters for performing an operation corresponding to the input command CMD according to the parameter skip signals PARA_SKIP_1, PARA_SKIP_2, . . . , PARA_SKIP_N, and generate the voltage setting signal BIAS_SET, the word line setting signal WL_SET, and the read/write control signal PB_CTRL for respectively controlling the operations of the voltage supply unit 340, the address decoder 350, and the read and write circuit 360, based on the one or more parameters. At this time, the parameter setting operation may include an operation of accessing a separate register to load a specific value, performing a computing operation on the specific value, and storing a final parameter value in a target register. In the present embodiment, the loading operation, the computing operation, and the storing operation may be selectively performed according to the parameter skip signals PARA_SKIP_1, PARA_SKIP_2, . . . , PARA_SKIP_N. That is, when the parameter skip signals PARA_SKIP_1, PARA_SKIP_2, . . . , PARA_SKIP_N are activated, the control signal generation unit 530 may skip setting the corresponding parameters.

Figure 6:
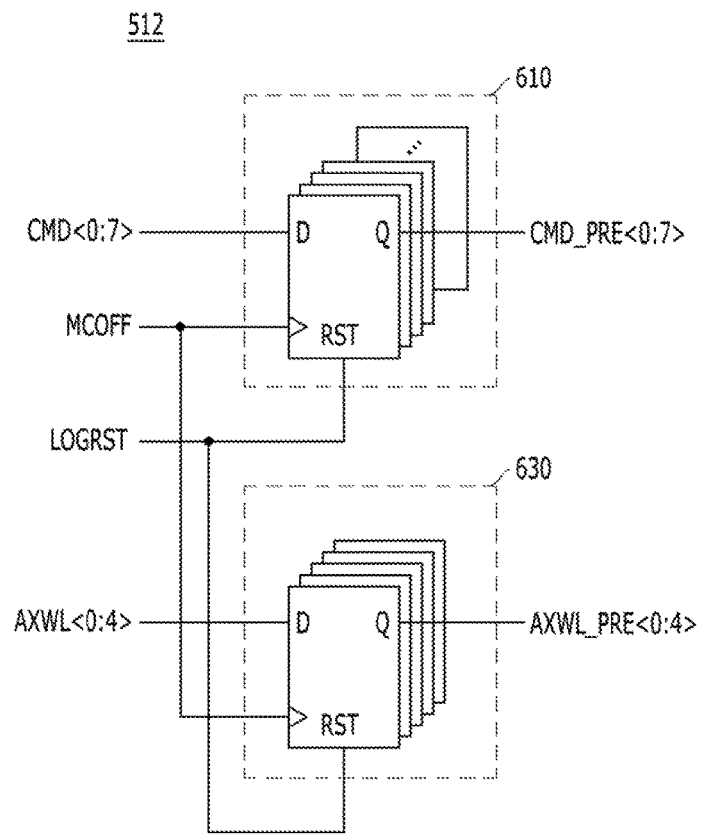
FIG. 6 is a detailed block diagram of a parameter storage unit of FIG. 5, according to an embodiment of the present invention.

FIG. 6 is a detailed block diagram of the parameter storage unit 512 of FIG. 5, according to an embodiment of the invention.

FIG. 6 illustrates an example in which an 8-bit command CMD<0:7> and a 5-bit target word line AXWL<0:4> are inputted.

Referring to FIG. 6, the parameter storage unit 512 may include first and second storage units 610 and 630. In response to the operation end signal MCOFF, the first storage unit 610 may store the input command CMD<0:7>, and the second storage unit 630 may store the target word line AXWL<0:4>. The first storage unit 610 and the second storage unit 630 may be reset in response to the reset signal LOGRST. In an embodiment, each of the first and second storage units 610 and 630 may include a plurality of flip-flops for storing input bits.

In the present embodiment, when the operation end signal MCOFF is activated after the input command CMD<0:7> and the address ADDR are inputted and an operation corresponding to the input command CMD<0:7> is performed, the parameter storage unit 512 may store the input command CMD<0:7> as the previous input command CMD_PRE<0:7>, and store the target word line AXWL<0:4> corresponding to the address ADDFR as the previous target word line AXWL_PRE<0:4>.

Figure 7:
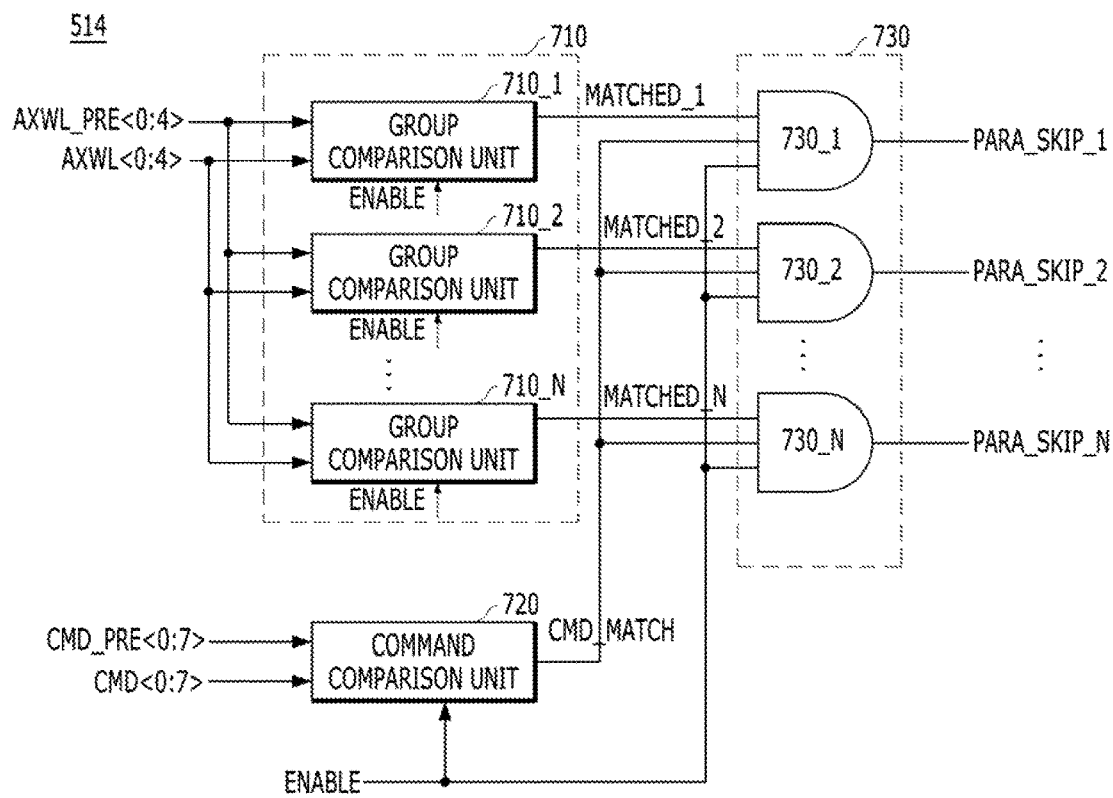
FIG. 7 is a detailed block diagram of a change detection unit of FIG. 5, according to an embodiment of the present invention.

FIG. 7 is a detailed block diagram of the change detection unit 514 of FIG. 5, according to an embodiment of the invention.

Referring to FIG. 7, the change detection unit 514 may include a word line group comparison unit 710, a command comparison unit 720, and a signal output unit 730.

The word line group comparison unit 710 may include first to Nth group comparison units 710_1 to 710_N. The first to Nth group comparison units 710_1 to 710_N may determine whether the target word line AXWL<0:4> corresponding to the input address ADDR and the previous target word line AXWL_PRE<0:4> stored in the parameter storage unit 512 of FIG. 6 are classified into the same word line group, based on the preset word line groups, and output group match signals MATCHED_1, MATCHED_2, . . . , MATCHED_N. At this time, the first to Nth group comparison units 710_1 to 710_N may preset the word line groups according to one or more of a program verification voltage level, a program start bias voltage, a pass voltage, a pipe gate voltage, a dummy word line voltage, a source line (DSL/SSL) voltage, the blind number, and the maximum loop number. When the target word line AXWL<0:4> corresponding to the input address ADDR and the previous target word line AXWL_PRE<0:4> stored in the parameter storage unit 512 of FIG. 6 are classified into the same word line group, the first to Nth group comparison units 710_1 to 710_N may activate and output the corresponding group match signals MATCHED_1, MATCHED_2, . . . , MATCHED_N.

The command comparison unit 720 may compare the input command CMD<0:7> with the input command CMD_PRE<0:7> stored in the parameter storage unit 512, and activate and output a command match signal CMD_MATCH when the two commands are of the same type.

The signal output unit 730 may output the plurality of group match signals MATCHED_1, MATCHED_2, . . . , MATCHED_N as the plurality of parameter skip signals PARA_SKIP_1, PARA_SKIP_2, . . . , PARA_SKIP_N in response to the command match signal CMD_MATCH.

For example, the word line group comparison unit 710, the command comparison unit 720, and the signal output unit 730 may be enabled in response to the operation enable signal ENABLE. In an embodiment, the signal output unit 730 may include a plurality of AND gates 730_1 to 730_N each configured to receive the operation enable signal ENABLE, the command match signal CMD_MATCH, and a corresponding signal among the plurality of group match signals MATCHED_1, MATCHED_2, . . . , MATCHED_N.

Hereafter, a detailed configuration of the first to Nth group comparison units 710_1 to 710_N will be described. At this time, since the first to Nth group comparison units 710_1 to 710_N have the same configuration, the following descriptions will be focused on the first group comparison unit 710_1.

Figure 8:
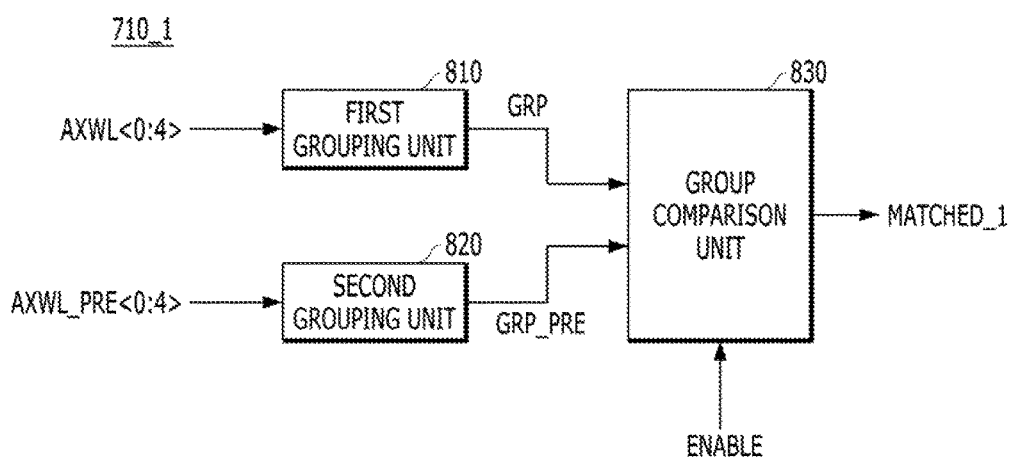
FIG. 8 is a detailed block diagram of a first group comparison unit of FIG. 7, according to an embodiment of the present invention.

FIG. 8 is a detailed block diagram of the first group comparison unit 710_1 of FIG. 7, according to an embodiment of the invention.

Referring to FIG. 8, the first group comparison unit 710_1 may include a first grouping unit 810, a second grouping unit 820, and a group comparison unit 830. The first grouping unit 810 may group the target word line AXWL<0:4> corresponding to the input address ADDR, based on the preset word line groups, the second grouping unit 820 may group the previous target word line AXWL_PRE<0:4> stored in the parameter storage unit 512, based on the preset word line groups, and the group comparison unit 830 may compare the result value GRP of the first grouping unit 810 with the result value GRP_PRE of the second grouping unit 820, and output the group match signal CMD_MATCH when the two result values are equal to each other. At this time, the group comparison unit 830 may be enabled in response to the operation enable signal ENABLE.

In the present embodiment, the change detection unit 514 may preset the word line groups according to a specific standard, and activate the parameter skip signals to skip parameter setting when a word line corresponding to an input address and a word line corresponding to the previous input address are classified into the same word line group. At this time, in order to set a plurality of specific standards, the word line group comparison unit 710 of the change detection unit 514 may include a plurality of group comparison units 710_1 to 710_N to skip parameter setting according to the various standards.

Hereafter, referring to FIGS. 9A and 9B, an operation of the nonvolatile memory device, according to an embodiment of the present invention will be described.

Figure 9A:
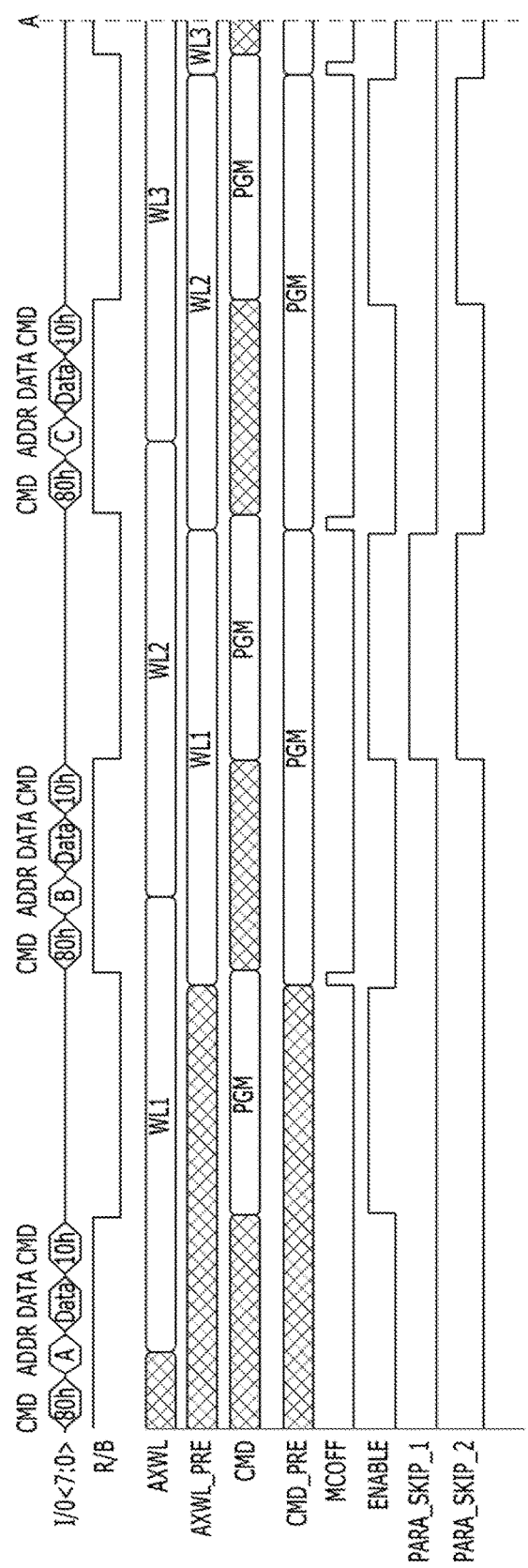

FIGS. 9A and 9B are waveform diagrams for describing an operation of the nonvolatile memory device 300 illustrated in FIGS. 3 to 8.

For convenience of description, the case in which the word line group comparison unit 710 of the change detection unit 514 includes two group comparison units 710_1 and 710_2 will be taken as an example for description. Also for example, assuming that eight word lines WL1 to WL8 exist, the first group comparison unit 710_1 may set the first and second word lines WL1 and WL2 using a first program start bias voltage to the first word line group, and set the third to eighth word lines WL3 to WL8 using a second program start bias voltage to the second word line group. The second group comparison unit 710_2 may set the first to third word lines WL1 to WL3 using a first pass voltage to the first word line group, set the fourth and fifth word lines WL4 and WL5 using a second pass voltage to the second word line group, and set the sixth to eighth word lines WL6 to WL8 using a third pass voltage to the third word line group.

Referring to FIG. 9A, first, a program sequence start command "80h", an address "A", page data "Data", and a program sequence end command "10h" may be sequentially inputted to the nonvolatile memory device 300 through the I/O line I/O<7:0> from the controller (not illustrated). At this time, after the program sequence end command "10h" is inputted, the ready/busy signal R/B of the nonvolatile memory device may transit to a low level from a high level and the operation enable signal ENABLE may transit to a high level from a low level.

The address decoder 350 may decode the address ADDR to select the first word line WL1 of the memory cell array 310, and provide the selected first word line WL1 as the target word line AXWL to the control logic 330. Since the first and second parameter skip signals PARA_SKIP_1 and PARA_SKIP_2 are deactivated when the first command is inputted, the control signal generation unit 530 may perform a setting operation for all parameters, and generate the voltage setting signal BIAS_SET, the word line setting signal WL_SET, and the read/write control signal PB_CTRL for respectively controlling the operations of the voltage supply unit 340, the address decoder 350, and the read and write circuit 360.

Then, in response to the operation end signal MCOFF which is activated when the program operation corresponding to the input command CMD is ended, the parameter setting control unit 510 of the control logic 330 may store the input command CMD and the target word line AXWL as the previous input command CMD_PRE and the previous target word line AXWL_PRE.

Second, a program sequence start command "80h", an address "B", page data "Data", and a program sequence end command "10h" may be sequentially inputted to the nonvolatile memory device 300 through the I/O line I/O<7:0> from the controller. The address decoder 350 may decode the address ADDR to select the second word line WL2 of the memory cell array 310, and provide the selected second word line WL2 as the target word line AXWL to the control logic 330.

Since the input command CMD is of the same type (i.e., a program command PGM) as the previous input command CMD_PRE, the parameter setting control unit 510 of the control logic 330 may detect whether the current target word line AXWL and the previous target word line AXWL_PRE are classified into the same word line group, and generate the first and second parameter skip signals PARA_SKIP_1 and PARA_SKIP_2. At this time, since the previous target word line AXWL_PRE is the first word line WL1 and the current word line AXWL is the second word line WL2, both of the first and second group comparison units 710_1 to 710_2 may determine that the previous target word line AXWL_PRE and the current target word line AXWL are classified into the same word line group, and activate the first and second parameter skip signals PARA_SKIP_1 and PARA_SKIP_2. Thus, the control signal generation unit 530 may skip setting the program start bias voltage and the pass voltage, and generate the voltage setting signal BIAS_SET, the word line setting signal WL_SET, and the read/write control signal PB_CTRL for respectively controlling the operations of the voltage supply unit 340, the address decoder 350, and the read and write circuit 360.

Then, in response to the operation end signal MCOFF, the parameter setting control unit 510 of the control logic 330 may store the input command CMD and the target word line AXWL as the previous input command CMD_PRE and the previous target word line AXWL_PRE.

Third, a program sequence start command "80h", an address "C", page data "Data", and a program sequence end command "10h" may be sequentially inputted to the nonvolatile memory device 300 through the I/O line I/O<7:0> from the controller. The address decoder 350 may decode the address ADDR to select the third word line WL3 of the memory cell array 310, and provide the selected third word line WL3 as the target word line AXWL to the control logic 330.

Since the input command CMD is of the same type (i.e., a program command PGM) as the previous input command CMD_PRE, the parameter setting control unit 510 of the control logic 330 may detect whether the current target word line AXWL and the previous target word line AXWL_PRE are classified into the same word line group, and generate the first and second parameter skip signals PARA_SKIP_1 and PARA_SKIP_2. At this time, since the previous target word line AXWL_PRE is the second word line WL2 and the current target word line AXWL is the third word line WL3, the first group comparison unit 710_1 may determine that the previous target word line AXWL_PRE and the current target word line AXWL belong to different groups, and deactivate the first parameter skip signal PARA_SKIP_1. On the other hand, the second group comparison unit 710_2 may determine that the previous target word line AXWL_PRE and the current target word line AXWL belong to the same word line group, and activate the second parameter skip signal PARA_SKIP_2. Thus, the control signal generation unit 530 may skip setting the pass voltage.

Then, in response to the operation end signal MCOFF, the parameter setting control unit 510 of the control logic 330 may store the input command CMD and the target word line AXWL as the previous input command CMD_PRE and the previous target word line AXWL_PRE.

Referring to FIG. 9B, fourth, a program sequence start command "80h", an address "D", page data "Data", and a program sequence end command "10h" may be sequentially inputted to the nonvolatile memory device 300 through the I/O line I/O<7:0> from the controller. The address decoder 350 may decode the address ADDR to select the fourth word line WL4 of the memory cell array 310, and provide the selected fourth word line WL4 as the target word line AXWL to the control logic 330.

Through the same process as described above, the first group comparison unit 710_1 may activate the first parameter skip signal PARA_SKIP_1, but the second group comparison unit 710_2 may deactivate the second parameter skip signal PARA_SKIP_2. Thus, the control signal generation unit 530 may skip setting the program start bias voltage. Then, in response to the operation end signal MCOFF, the parameter setting control unit 510 of the control logic 330 may store the input command CMD and the target word line AXWL as the previous input command CMD_PRE and the previous target word line AXWL_PRE.

Fifth, a read sequence start command "00h", an address "E", and a read sequence end command "30h" may be sequentially inputted to the nonvolatile memory device 300 through the I/O line I/O<7:0> from the controller. At this time, since the input command CMD is a different type of command (I.e., a read command READ) from the previous input command CMD_PRE, the parameter setting control unit 510 of the control logic 330 may perform a setting operation for all parameters.

Sixth, a program sequence start command "80h", an address "F", page data "Data", and a program sequence end command "10h" may be sequentially inputted to the nonvolatile memory device 300 through the I/O line I/O<7:0> from the controller. Similarly, since the input command CMD is a different type of command (i.e., a program command PGM) from the previous input command CMD_PRE, the parameter setting control unit 510 of the control logic 330 may perform a setting operation for all parameters.

Figure 10:
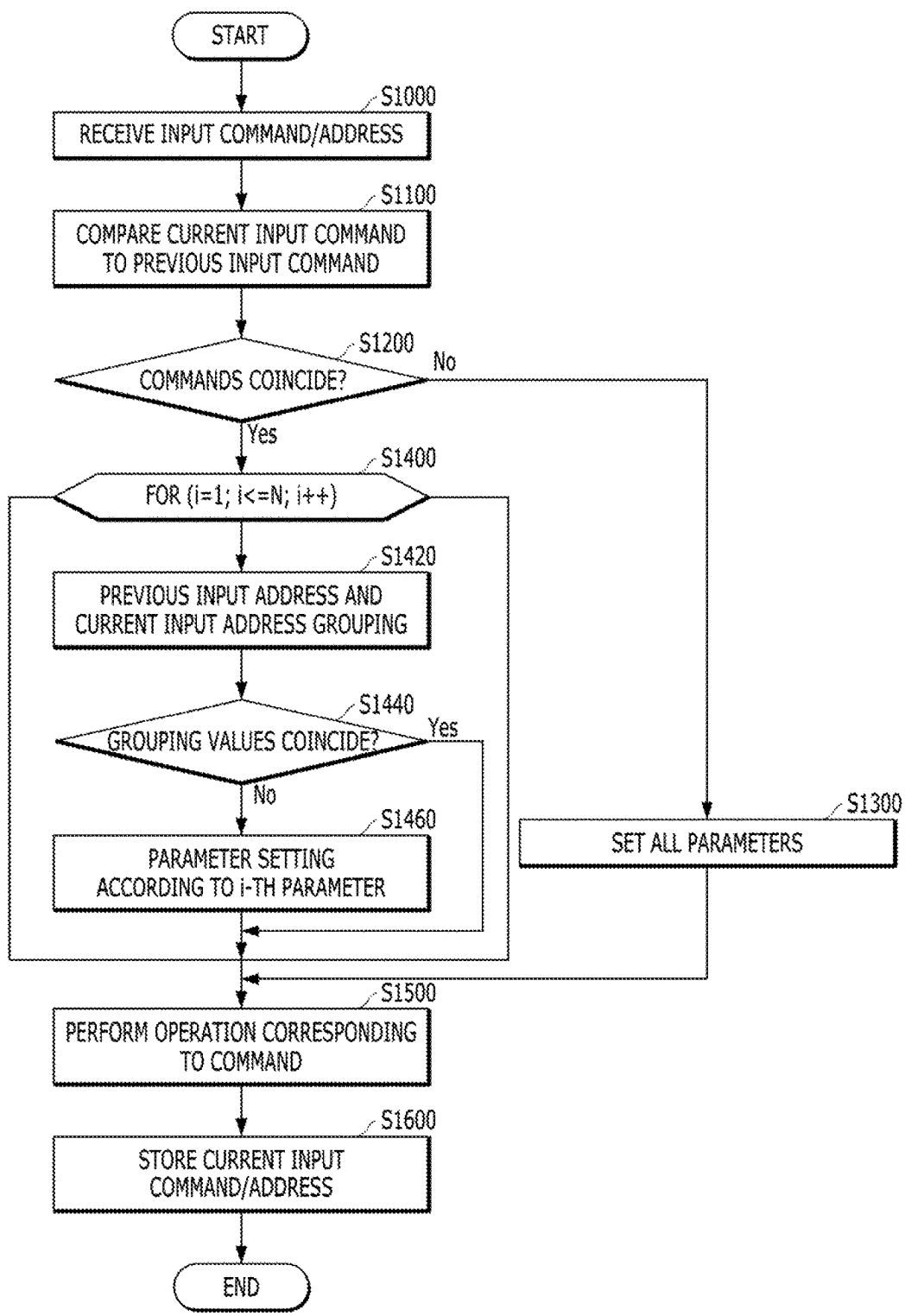
FIG. 10 is a flowchart of an operation of the nonvolatile memory device illustrated in FIGS. 3 to 8, according to an embodiment of the present invention.

FIG. 10 is a flowchart of an operation of the nonvolatile memory device 300 illustrated in FIGS. 3 to 8, according to an embodiment of the invention.

Referring to FIG. 10, the nonvolatile memory device 300 may receive the input command CMD and the input address ADDR from the controller (not illustrated) at step S1000. The parameter setting control unit 510 of the control logic 330 may compare the input command CMD with the previous input command CMD_PRE at step S1100. When the input command CMD and the previous input command CMD_PRE are not of the same type (No of S1200), the parameter setting control unit 510 may deactivate all of the parameter skip signals PARA_SKIP_1, PARA_CKIP_2, . . . , PARA_SKIP_N. Thus, the control signal generation unit 530 of the control logic 330 may set all parameters, and generate the voltage setting signal BIAS_SET, the word line setting signal WL_SET, and the read/write control signal PB_CTRL, at step S1300.

On the other hand, when the input command CMD and the previous input command CMD_PRE are of the same type (Yes of S1200), the parameter setting control unit 510 may detect whether the target word line AXWL corresponding to the input address ADDR and the previous target word line AXWL_PRE corresponding to the previous input address are classified into the same word line group, and one or more parameters according to the detection result, at step S1400. At this time, the parameter setting control unit 510 may detect whether the target word line AXWL corresponding to the input address ADDR and the previous target word line AXWL_PRE corresponding to the previous input address are classified into the same word line group, based on word line groups which are preset according to a specific standard.

More specifically, the parameter setting control unit 510 may group the target word line AXWL corresponding to the input address ADDR based on the preset word line groups, and group the previous target word line AXWL_PRE corresponding to the previous input address, based on the preset word line groups, at step S1420.

When the grouping values do not coincide with each other (No of S1440), that is, when the target word line group AXWL and the previous target word line group AXWL_PRE belong to different word line groups, the control signal generation unit 530 of the control logic 330 may set one or more parameters corresponding to the word line groups, and generate the voltage setting signal BIAS_SET, the word line setting signal WL_SET, and the read/write control signal PB_CTRL, at step S1460.

On the other hand, when the grouping values coincide with each other (Yes of S1440), that is, when the target word line group AXWL and the previous target word line group AXWL_PRE belong to the same word line group, the control signal generation unit 530 of the control logic 330 may skip setting parameters corresponding to the word line group, and generate the voltage setting signal BIAS_SET, the word line setting signal WL_SET, and the read/write control signal PB_CTRL. The parameter setting operation S1400 for each of the word line groups may be repeated by the number of first to Nth group comparison units 710_1 to 710_N within the word line group comparison unit 710.

The voltage supply unit 340, the address decoder 350, and the read and write circuit 360 may perform an operation corresponding to the input command CMD in response to the voltage setting signal BIAS_SET, the word line setting signal WL_SET, and the read/write control signal PR_CTRL, at step S1500.

Then, in response to the operation end signal MCOFF which is activated when the program operation corresponding to the input command CMD is ended, the parameter setting control unit 510 of the control logic 330 may store the input command CMD and the target word line AXWL as the previous input command CMD_PRE and the previous target word line AXWL_PRE, at step S1600.

As described above, the control logic 330 in accordance with an embodiment of the present invention may set one or more parameters corresponding to the input command CMD, and perform an operation corresponding to the input command CMD, that is, at least one of a program, read and erase operation on the memory cell array 310, based on the one or more parameters. When the input command CMD is of the same type as the previous input command CMD, the control logic 330 may skip setting duplicate parameters for each of the preset word line groups while maintaining the previous values of the parameters. Thus, the control logic 330 can reduce the time required for the preparation period, thereby reducing the time required for the entire operation and guaranteeing a higher-speed operation than with existing memory devices.

Figure 11:
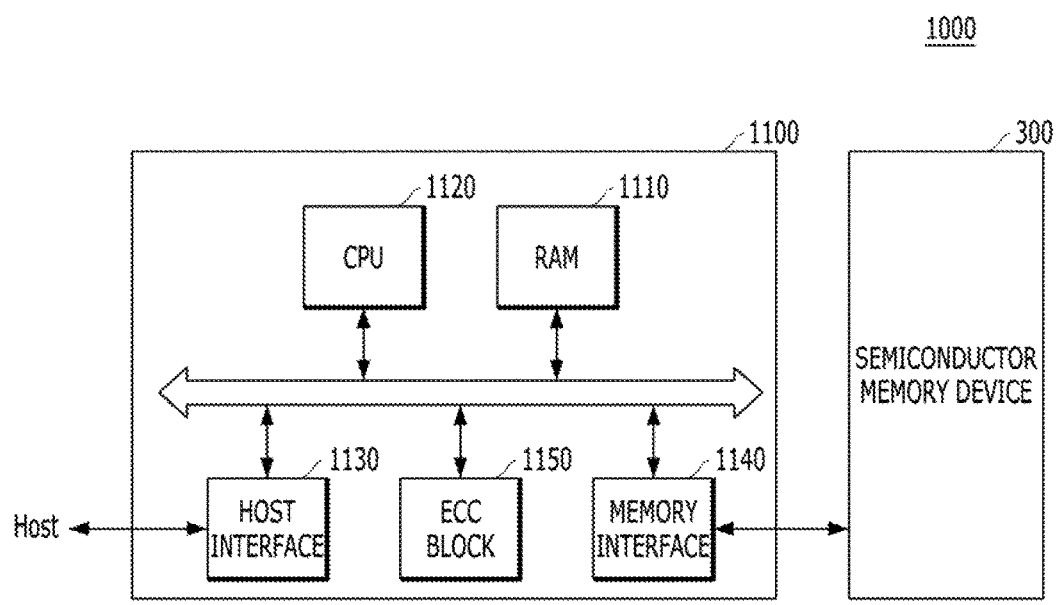
FIG. 11 is a block diagram illustrating a memory system including the nonvolatile memory device shown in FIG. 3, according to an embodiment of the present invention.

FIG. 11 is a block diagram illustrating a memory system including the nonvolatile memory device 300 shown in FIG. 3, according to an embodiment of the invention.

Referring to FIG. 11, the memory system 1000 may include the nonvolatile memory device 300 and a controller 1100.

The nonvolatile memory device 300 may be configured and manufactured as described above with reference to FIG. 3, hence, a detailed description thereof will now be omitted.

The controller 1100 may be connected to a host and the nonvolatile memory device 300 and may be suitable for accessing the nonvolatile memory device 300 in response to a request from the host. For example, the controller 1100 may be suitable for controlling read, write, erase and background operations of the nonvolatile memory device 300. The controller 1100 may be suitable for performing interfacing between the nonvolatile memory device 300 and the host. The controller 1100 may be suitable for operating firmware to control the nonvolatile memory device 300.

The controller 1100 may include random access memory (RAM) 1110, a central processing unit (CPU) 1120, a host interface 1130, a memory interface 1140, and an error correction code (ECC) block 1150. The RAM 1110 may be used as an operation memory of the CPU 1120, a cache memory between the memory device 1200 and the host, and a buffer memory between the memory device 1200 and the host. The CPU 1120 may control the overall operation of the controller 1100. The controller 1100 may temporarily store program data provided from the host during a read operation.

The host interface 1130 may include a protocol for data exchange between the host and the controller 1100. For example, the controller 1100 may communicate with the host through at least one of various protocols, such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, a private protocol, and the like.

The memory interface 1140 may be suitable for performing interfacing with the nonvolatile memory device 300. For example, the memory interface 1140 may include a NAND flash interface or a NOR flash interface.

The ECC block 1150 may be suitable for detecting and correcting errors in data read from the nonvolatile memory device 300 using an error correcting code. The CPU 1120 may control a read voltage according to an error detection result of the ECC block 1150 and control the nonvolatile memory device 300 to perform a re-read operation. According to an embodiment, the ECC block may be provided as a component of the controller 1100.

The controller 1100 and the nonvolatile memory device 300 may be integrated in a single semiconductor device. According to an embodiment, the controller 1100 and the nonvolatile memory device 300 may be integrated in a single semiconductor device to form a memory card, such as a personal computer memory card international association (PCMCIA), a compact flash card (CF), a smart media card (SMC), a memory stick, a multimedia card (MMC), a reduced size MMC (RS-MMC), a micro-MMC, a secure digital (SD) card, a mini-SD, a micro-SD, an SDHC, a universal flash storage device (UFS), and the like.

The controller 1100 and the nonvolatile memory device 300 may be integrated in a single semiconductor device to form a semiconductor drive, e.g., a Solid State Drive (SSD). The semiconductor drive (SSD) may include a storage device configured to store data in a semiconductor memory. When the memory system 2000 is used as the semiconductor drive (SSD), the operating speed of the host coupled to the memory system 1000 may be significantly improved.

In another example, the memory system 1000 may be used as one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home networks, one of various electronic devices for computer networks, one of various electronic devices for telematics networks, an RFID device and/or one of various devices for computing systems, and the like.

In an embodiment, the nonvolatile memory device 300 or the memory system 1000 may be packaged in a variety of ways, such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) and/or a wafer-level processed stack package (WSP), and the like.

Figure 12:
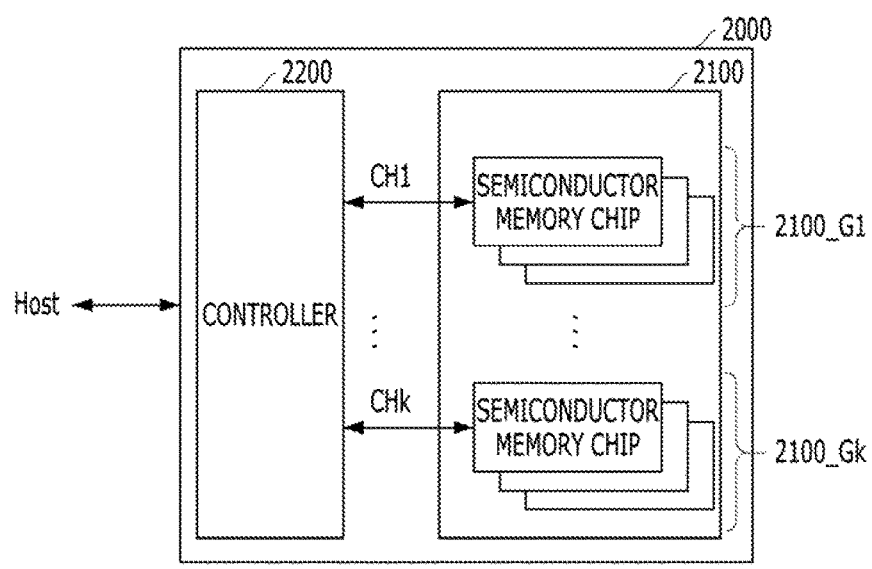
FIG. 12 is a block diagram illustrating an application example of the memory system shown in FIG. 11, according to an embodiment of the present invention.

FIG. 12 is a block diagram illustrating an application example 2000 of the memory system 1000 shown in FIG. 11, according to an embodiment of the invention.

Referring to FIG. 12, the memory system 2000 may include a semiconductor memory device 2100 and a controller 2200. The semiconductor memory device 2100 may include a plurality of semiconductor memory chips. The semiconductor memory chips may be divided into a plurality of groups 2100_G1 to 2100_GK.

In FIG. 12, the plurality of groups in the semiconductor memory chips communicate with the controller 2200 through first to k-th channels CH1 to CHk, respectively. Each of the memory chips may be configured and operated in substantially the same manner as the nonvolatile memory device 300 described above with reference to FIG. 3.

Each of the groups 2100_G1 to 2100_GK in the semiconductor memory chips may communicate with the controller 2200 through a single common channel. The controller 2200 may be configured in substantially the same manner as the controller 1100 described above with reference to FIG. 11 and may control the plurality of memory chips of the semiconductor memory device 2100.

Figure 13:
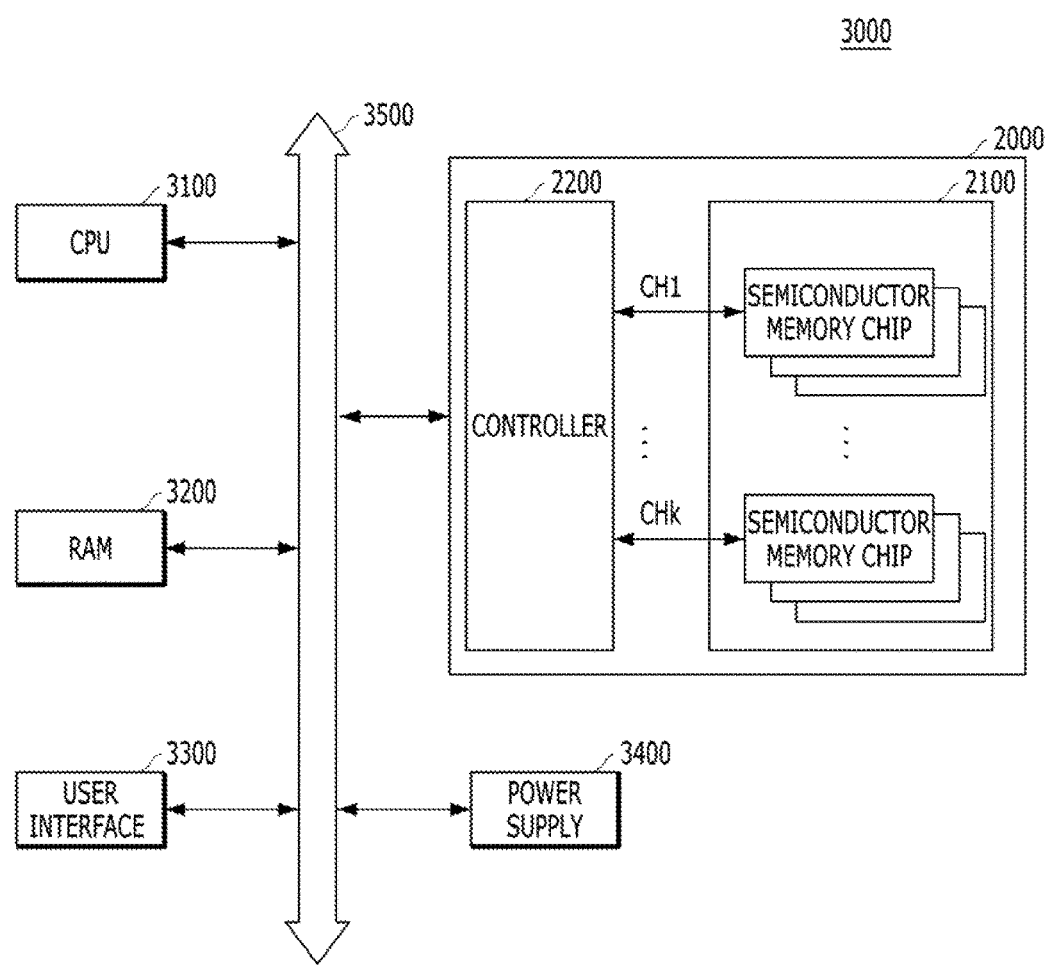
FIG. 13 is a block diagram illustrating a computing system including the memory system shown in FIG. 12, according to an embodiment of the present invention.

FIG. 13 is a block diagram illustrating a computing system 3000 including the memory system 2000 shown in FIG. 12, according to an embodiment of the invention.

Referring to FIG. 13, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

According to the illustrated embodiment of FIG. 13, the semiconductor memory device 2100 may be coupled to the system bus 3500 through the controller 2200. However, we note that the semiconductor memory device 2100 may be directly coupled to the system bus 3500 in which case one or more functions of the controller 2200 may be performed by the central processing unit 3100 and the RAM 3200.

FIG. 13 illustrates the memory system 2000 described above with reference to FIG. 12. However, we note, that the memory system 2000 may be replaced with the memory system 1000 described above with reference to FIG. 11. In an embodiment, the computing system 3000 may include both memory systems 1000 and 2000 described above with reference to FIGS. 11 and 12, respectively.

Though FIGS. 11 to 13 illustrate a memory system including a memory device, the present invention is not limited to a memory system. That is, the present invention may extend to a semiconductor system.

Figure 14:
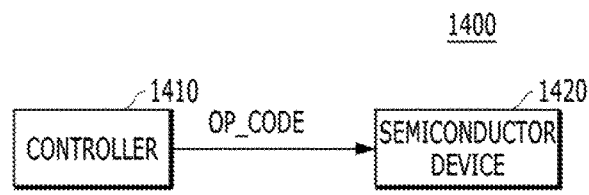
FIG. 14 is a block diagram illustrating a semiconductor system according to an embodiment of the present invention.
Figure 15:
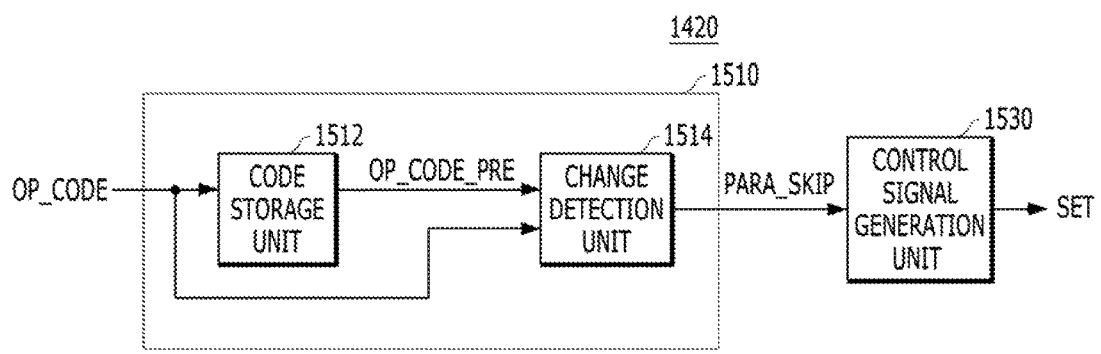
FIG. 15 is a block diagram illustrating a semiconductor device shown in FIG. 14, according to an embodiment of the present invention.

FIG. 14 is a block diagram illustrating a semiconductor system 1400, according to an embodiment of the present invention. FIG. 15 is a block diagram illustrating a semiconductor device 1420 shown in FIG. 14.

Referring to FIG. 14, the semiconductor system 1400 may include a controller 1410 and the semiconductor device 1420. The controller 1410 may output an operation code OP_CODE for performing various operations of the semiconductor device 1420, and the semiconductor device 1420 may perform an operation corresponding to the operation code OP_CODE.

In accordance with the embodiment of the present invention, the semiconductor device 1420 may set one or more parameters corresponding to the operation code OP_CODE, and perform an operation corresponding to the operation code OP_CODE based on the one or more parameters. At this time, when the operation code OP_CODE is of the same type as the previous operation code OP_CODE, the semiconductor device 1420 may skip setting duplicate parameters while maintaining the previous values of the parameters. Accordingly, the semiconductor system 1400 can reduce the time required during the preparation period, thereby reducing the time required for the entire operation and guaranteeing a higher operational speed than existing systems.

Referring to FIG. 15, the semiconductor device 1420 may include a parameter setting control unit 1510 and a control signal generation unit 1530.

The parameter setting control unit 1510 may generate at least one parameter skip signal PARA_SKIP when the operation code OP_CODE is of the same type as the previous operation code OP_CODE. Though FIG. 15 shows one parameter skip signal PARA_SKIP, the parameter setting control unit 1510 may generate a plurality of parameter skip signals PARA_SKIP.

The parameter setting control unit 1510 may include a code storage unit 1512 and a change detection unit 1514. The code storage unit 1512 may correspond to the first storage unit 610 of the parameter storage unit 512 shown in FIGS. 5 and 6. The change detection unit 1514 may correspond to the command comparison unit 720 of the change detection unit 514 shown in FIGS. 5 and 7.

The control signal generation unit 1530 may set one or more parameters for performing an operation corresponding to the operation code OP_CODE in response to the parameter skip signal PARA_SKIP, and generate a control signal SET based on the one or more parameters. At this time, the parameter setting operation may include an operation of accessing a separate register to load a specific value, performing a computing operation on the value, and storing a final parameter value in a target register. In the present embodiment, the loading operation, the computing operation, and the storing operation may be selectively performed according to the parameter skip signal PARA_SKIP. That is, when the parameter skip signal PARA_SKIP are activated, the control signal generation unit 1530 may skip setting the corresponding parameters. The control signal generation unit 1530 may correspond to the control signal generation unit 530 shown in FIG. 5.

In accordance with the above described embodiments of the present invention, when a current Input command is of the same type as the previous input command, the semiconductor memory may skip setting duplicate parameters for each of preset word line groups while maintaining the previous values of the parameters, thereby reducing the time required for performing the entire operation and guaranteeing a high-speed operation.

Although various embodiments have been described for illustrative purposes, it will be apparent to those skilled in the art that various changes and modifications may be made without departing from the spirit and/or scope of the present invention as defined in the following claims.

For example, the positions and types of the logic gates and transistors used in the above-described embodiments may be set in different manners according to the polarities of input signals.

What is claimed is:

1. A semiconductor memory device comprising:
a memory cell array comprising a plurality of memory cells coupled to a plurality of bit line pairs and a plurality of word lines; and
an operation circuit suitable for setting a parameter corresponding to an input command, and performing an operation corresponding to the input command on the memory cell array based on the set parameter,
wherein, when the input command is of the same type as a previous input command, the operation circuit skips setting the parameter for each of preset word line groups,
wherein the preset word line groups are preset according to one or more of a program verification voltage level, a program start bias voltage, a pass voltage, a pipe gate voltage, a dummy word line voltage, a source line voltage, a blind number, and a maximum loop number.

2. A semiconductor memory device comprising:
a memory cell array comprising a plurality of memory cells coupled to a plurality of bit line pairs and a plurality of word lines; and
an operation circuit suitable for setting a parameter corresponding to an input command, and performing an operation corresponding to the input command on the memory cell array based on the set parameter,
wherein, when the input command is of the same type as a previous input command, the operation circuit skips setting the parameter for each of preset word line groups,
wherein the operation circuit comprises:
a voltage supply unit suitable for generating one or more operation voltages for at least one of a program, read and erase operations based on the set parameter;
an address decoder suitable for selecting a word line of the memory cell array according to an input address, and selectively applying the one or more operation voltages to the respective word lines of the memory cell array based on the set parameter;
a read and write circuit coupled to the bit lines of the memory cell array and suitable for reading/writing data of the memory cell array based on the set parameter; and
a control logic suitable for controlling operations of the voltage supply unit, the address decoder, and the read and write circuit by setting the parameter for performing an operation corresponding to the input command while skipping setting the parameter for each of the preset word line groups when the input command is of the same type as the previous input command.

3. The semiconductor memory device of claim 2, wherein the control logic comprises:
a parameter setting control unit suitable for detecting whether a word line corresponding to the input address and a word line corresponding to the previous input command are classified into the same word line group, and generating one or more parameter skip signals, when the input command is of the same type as the previous input command; and
a control signal generation unit suitable for setting the parameter for performing the operation corresponding to the input command according to the parameter skip signal, and generating control signals for controlling the operations of the voltage supply unit, the address decoder, and the read and write circuit based on the set parameter.

4. The semiconductor memory device of claim 3, wherein the parameter setting control unit comprises:
a parameter storage unit suitable for storing the input command and the word line corresponding to the input address, in response to an operation end signal; and
a change detection unit suitable for detecting whether the word line corresponding to the input address and the word line stored in the parameter storage unit are classified into the same word line group, and outputting the parameter skip signal, when the input command is the same type of address as the input command stored in the parameter storage unit, in response to an operation enable signal.

5. The semiconductor memory device of claim 4, wherein the operation end signal is activated when the operation corresponding to the input command is ended, and the operation enable signal is activated while the operation corresponding to the input command is performed.

6. The semiconductor memory device of claim 4, wherein the parameter storage unit comprises a plurality of flip-flops suitable for storing the corresponding input command and the corresponding input address in response to the operation end signal.

7. The semiconductor memory device of claim 4, wherein the change detection unit comprises:
a word line group comparison unit suitable for determining whether the word line corresponding to the input address and the word line stored in the parameter storage unit are classified into the same word line group, based on the preset word line groups, and outputting one or more group match signals;
a command comparison unit suitable for activating and outputting a command match signal when the input command is of the same type as the input command stored in the parameter storage unit; and
a signal output unit suitable for outputting the group match signal as the parameter skip signal according to the command match signal.

8. The semiconductor memory device of claim 7, wherein the word line group comparison unit, the command comparison unit, and the signal output unit are enabled in response to the operation enable signal.

9. The semiconductor memory device of claim 7, wherein the word line group comparison unit comprises a plurality of group comparison units, and
each of the group comparison units determines whether the word line corresponding to the input address and the word line stored in the parameter storage unit are classified into the same word line group, based on the preset word line groups, and outputs a corresponding one of the group match signals.

10. The semiconductor memory device of claim 9, wherein each of the group comparison units comprises:
a first grouping unit suitable for grouping the word line corresponding to the input address, based on the preset word line groups;
a second grouping unit suitable for grouping the word line stored in the parameter storage unit, based on the preset word line groups; and
a group comparison unit suitable for comparing a result value of the first grouping unit to a result value of the second grouping unit and outputting the group match signal when the result values coincide with each other.

11. The semiconductor memory device of claim 3, wherein, when the parameter skip signal is deactivated, the control signal generation unit accesses a first register to load a specific value corresponding to the parameter, performs a computing operation on the specific value, and stores a final parameter value in a second register so as to set the parameter.

12. A semiconductor memory device comprising:
a memory cell array comprising a plurality of memory cells, wherein word lines of the memory cells are grouped by a predetermined number of word lines;
a parameter setting control unit suitable for detecting whether a word line corresponding to an input address and a word line corresponding to the previous input address are classified into the same word line group, based on preset word line groups, and generating a plurality of parameter skip signals, when an input command is of the same type as the previous input command;
a control signal generation unit suitable for selectively skipping setting parameters for performing an operation corresponding to the input command according to the plurality of parameter skip signals, and generating a control signal based on the one or more parameters;
a voltage supply unit suitable for generating operation voltages for at least one of a program, read and erase operations according to the control signal;
an address decoder suitable for selecting a word line of the memory cell array according to the input address, and selectively applying the operation voltages to the respective word lines of the memory cell array according to the control signal; and
a read and write circuit coupled to bit lines of the memory cell array and suitable for reading/writing data of the memory cell array according to the control signal.

13. The semiconductor memory device of claim 12, wherein the parameter setting control unit comprises:
a parameter storage unit suitable for storing the input command and the word line corresponding to the input address, in response to an operation end signal;
a plurality of group comparison units each suitable for determining whether the word line corresponding to the input address and the word line stored in the parameter storage unit are classified into the same word line group, based on the preset word line groups, and outputting a corresponding group match signal;
a command comparison unit suitable for activating and outputting a command match signal when the input command is the same type of address as the input command stored in the parameter storage unit; and
a signal output unit suitable for outputting the plurality of group match signals as the parameter skip signals, according to the command match signal.

14. The semiconductor memory device of claim 13, wherein the preset word line groups are preset according to one or more of a program verification voltage level, a program start bias voltage, a pass voltage, a pipe gate voltage, a dummy word line voltage, a source line voltage, the blind number, and the maximum loop number.

15. The semiconductor memory device of claim 13, wherein each of the group comparison units comprises:
a first grouping unit suitable for grouping the word line corresponding to the input address, based on the preset word line groups;
a second grouping unit suitable for grouping the word line stored in the parameter storage unit, based on the preset word line groups; and
a group comparison unit suitable for comparing a result value of the first grouping unit to a result value of the second grouping unit and outputting the group match signal when the result values coincide with each other.

16. The semiconductor memory device of claim 12, wherein, in response to deactivated signals among the plurality of parameter skip signals, the control signal generation unit accesses a first register to load a specific value corresponding to the parameter, performs a computing operation on the specific value, and stores a final parameter value in a second register to set the parameter.

17. A semiconductor system comprising:
a controller suitable for outputting an operation code for performing various operations; and a semiconductor device suitable for setting a parameter corresponding to the operation code, and performing an operation corresponding to the operation code based on the set parameter, wherein the semiconductor device skips setting the parameter when the operation code is the same type of code as the previous operation code, wherein the semiconductor device comprises:
- a parameter setting control unit suitable for generating one or more parameter skip signals when the operation code is the same type of code as the previous operation sign; and
- a control signal generation unit suitable for setting the parameter for performing the operation corresponding to the operation code according to the parameter skip signal, and generating a control signal based on the set parameter.

18. The semiconductor system of claim 17, wherein the parameter setting control unit comprises:
- a code storage unit suitable for storing the operation code; and
- a change detection unit suitable for outputting the parameter skip signal when the operation code is the same type of code as the operation code stored in the code storage unit.

* * * * *